United States Patent
Sekine et al.

(10) Patent No.: US 8,580,581 B2
(45) Date of Patent: Nov. 12, 2013

(54) SUBSTRATE FOR ELECTRONIC DEVICE, STACK FOR ELECTRONIC DEVICE, ELECTRONICE DEVICE, AND METHOD FOR MANUFACTURING THE SAME

(75) Inventors: Shigenobu Sekine, Katsushika-Ku (JP); Yurina Sekine, Katsushika-Ku (JP); Yoshiharu Kuwana, Katsushika-Ku (JP)

(73) Assignee: Napra Co., Ltd., Tokyo (JP)

( * ) Notice: Subject to any disclaimer, the term of this patent is extended or adjusted under 35 U.S.C. 154(b) by 312 days.

(21) Appl. No.: 12/943,447

(22) Filed: Nov. 10, 2010

(65) Prior Publication Data

US 2011/0140281 A1 Jun. 16, 2011

(30) Foreign Application Priority Data

Dec. 11, 2009 (JP) ................................. 2009-281839

(51) Int. Cl.
 *H01L 21/00* (2006.01)
(52) U.S. Cl.
 USPC ............................................. 438/3; 438/975
(58) Field of Classification Search
 USPC ...................................... 438/3, 975; 414/936
 See application file for complete search history.

(56) References Cited

U.S. PATENT DOCUMENTS 5,995,293 A * 11/1999 Derkits et al. ................. 359/642
6,583,847 B2 * 6/2003 Callegari et al. .............. 349/158

FOREIGN PATENT DOCUMENTS

| JP | 6-112270 | 4/1994 |
| JP | 10-112477 | 4/1998 |
| JP | 11-298138 | 10/1999 |
| JP | 2000-228410 | 8/2000 |
| JP | 2002-158191 | 5/2002 |
| JP | 2003-257891 | 9/2003 |
| JP | 2006-111896 | 4/2006 |

* cited by examiner

*Primary Examiner* — Jarrett Stark
*Assistant Examiner* — John M Parker
(74) *Attorney, Agent, or Firm* — Oblon, Spivak, McClelland, Maier & Neustadt, L.L.P.

(57) ABSTRACT

A method for manufacturing an electronic device, including a step of aligning and stacking a plurality of substrates, each of the plurality of substrates having a plurality of vertical conductors and magnetic films, the vertical conductors being directed along a thickness direction of the substrate and distributed in a row with respect to a substrate surface, the magnetic films being disposed in place on the substrate surface in a predetermined positional relationship with the vertical conductors, upon aligning the plurality of substrates, the electronic device manufacturing method including a step of applying an external magnetic field to produce a magnetic attractive force between the magnetic films of adjacent stacked substrates and align the vertical conductors by the magnetic attractive force.

2 Claims, 6 Drawing Sheets

SUBSTRATE FOR ELECTRONIC DEVICE, STACK FOR ELECTRONIC DEVICE, ELECTRONICE DEVICE, AND METHOD FOR MANUFACTURING THE SAME

TECHNICAL FIELD

The present invention relates to a substrate for an electronic device, a stack for an electronic device, an electronic device, and a method for manufacturing the same.

BACKGROUND OF THE INVENTION

Examples of electronic devices include various scales of integrated circuits and various types of semiconductor devices and chips thereof. As means for realizing a three-dimensional circuit configuration in electronic devices of this type, there has been adopted a method of disposing LSIs on a circuit board and connecting them by means of wire bonding or the like. However, this method increases the mounting area with the number of LSIs, so that the signal delay between LSIs increases because of an increase in wiring length.

Accordingly, there has been proposed a TSV (through-silicon-via) technology of providing a circuit board with a large number of through electrodes and stacking these circuit boards. Japanese Unexamined Patent Application Publication Nos. 11-298138, 2000-228410, 2002-158191, 2003-257891, and 2006-111896 disclose a through electrode formation technology essential for the TSV technology. The superiority of the TSV technology over the wire bonding is as follows.

At first, in the wire bonding, the number of connections is limited to 100 to 200, but the use of the TSV technology allows arrangement of connecting through electrodes at intervals of the order of μm, making it possible to increase the number of connections to several thousand.

In addition, there can be obtained advantages as follows: since connection distance can be minimized, it is less likely to be affected by noise; since parasitic capacitance and resistance are low, it is possible to reduce delay, attenuation, or waveform degradation; an additional circuit is not required for amplification or electrostatic breakdown protection; and with these advantages, there can be realized high speed action and low power consumption of the circuit.

By using the TSV technology, it is possible to obtain not only an electronic device including an analog or digital circuit, a memory circuit such as a DRAM, a logic circuit such as a CPU, or the like, but also an electronic device including different types of circuits such as an analog high frequency circuit and a low frequency, low power consumption circuit prepared in different processes and stacked together.

By applying the TSV technology to a three-dimensional integrated circuit (3D IC), many functions can be packed into a small footprint. In addition, important electrical pathways between devices can be dramatically shortened to increase processing speed.

In the TSV technology, however, since substrates formed with through electrodes have to be stacked, it is necessary to align the through electrodes between the substrates to be stacked. Heretofore, an image processing technology has been used for the alignment. However, since the through electrodes are arranged at intervals of the order of μm, it is difficult for the image processing technology to achieve accurate alignment. Even if the alignment can be achieved on a screen, there is still a possibility of causing displacement between the substrates in an actual process.

SUMMARY OF THE INVENTION

It is an object of the present invention to provide a manufacturing method capable of simply, certainly, and accurately performing alignment upon stacking during production of an electronic device using a TSV technology, and a substrate, a stack, and an electronic device therefor.

In order to achieve the above object, the present invention provides a method for manufacturing an electronic device, comprising a step of aligning and stacking a plurality of substrates, wherein each of the plurality of substrates has a plurality of vertical conductors and magnetic films. The vertical conductors are distributed in a row with respect to a substrate surface. The magnetic films are disposed on the substrate surface in a predetermined positional relationship with the vertical conductors.

Upon aligning the plurality of substrates, an external magnetic field is applied to produce a magnetic attractive force between the magnetic films of adjacent stacked substrates and align the vertical conductors by the magnetic attractive force. That is, the magnetic films serve as a magnetic alignment marker.

In the present invention, as described above, the magnetic films are disposed in place on the substrate surface in a predetermined positional relationship with the vertical conductors and a magnetic attractive force is produced between the magnetic films of adjacent substrates and align the vertical conductors by the magnetic attractive force, so that the alignment of the vertical conductors upon stacking during production of an electronic device using a TSV technology can be performed simply, certainly, and accurately as compared with the conventional image processing.

In addition, since the magnetic attractive force acts between the stacked substrates as long as the magnetic field is applied, the substrates can be prevented from being displaced during stacking or a subsequent process such as a joining process.

The vertical conductor may be a through electrode filling a through hole passing through the substrate or an electrode filling a blind hole whose bottom is closed.

The magnetic film may be disposed on at least one end face of the vertical conductor. In this case, the magnetic film forms a part of the vertical conductor. Alternatively, the magnetic film may be disposed outside the vertical conductor.

Particularly, the magnetic film may contain Ni, Co, Fe, or an alloy thereof.

The present invention further discloses a substrate suitable for use in the above manufacturing method, a stack formed by stacking these substrates, and also an electronic device using the above manufacturing method or the stack.

The other objects, constructions and advantages of the present invention will be further detailed below with reference to the attached drawings. However, the attached drawings show only illustrative examples.

DESCRIPTION OF THE PREFERRED EMBODIMENTS

Figure 1:
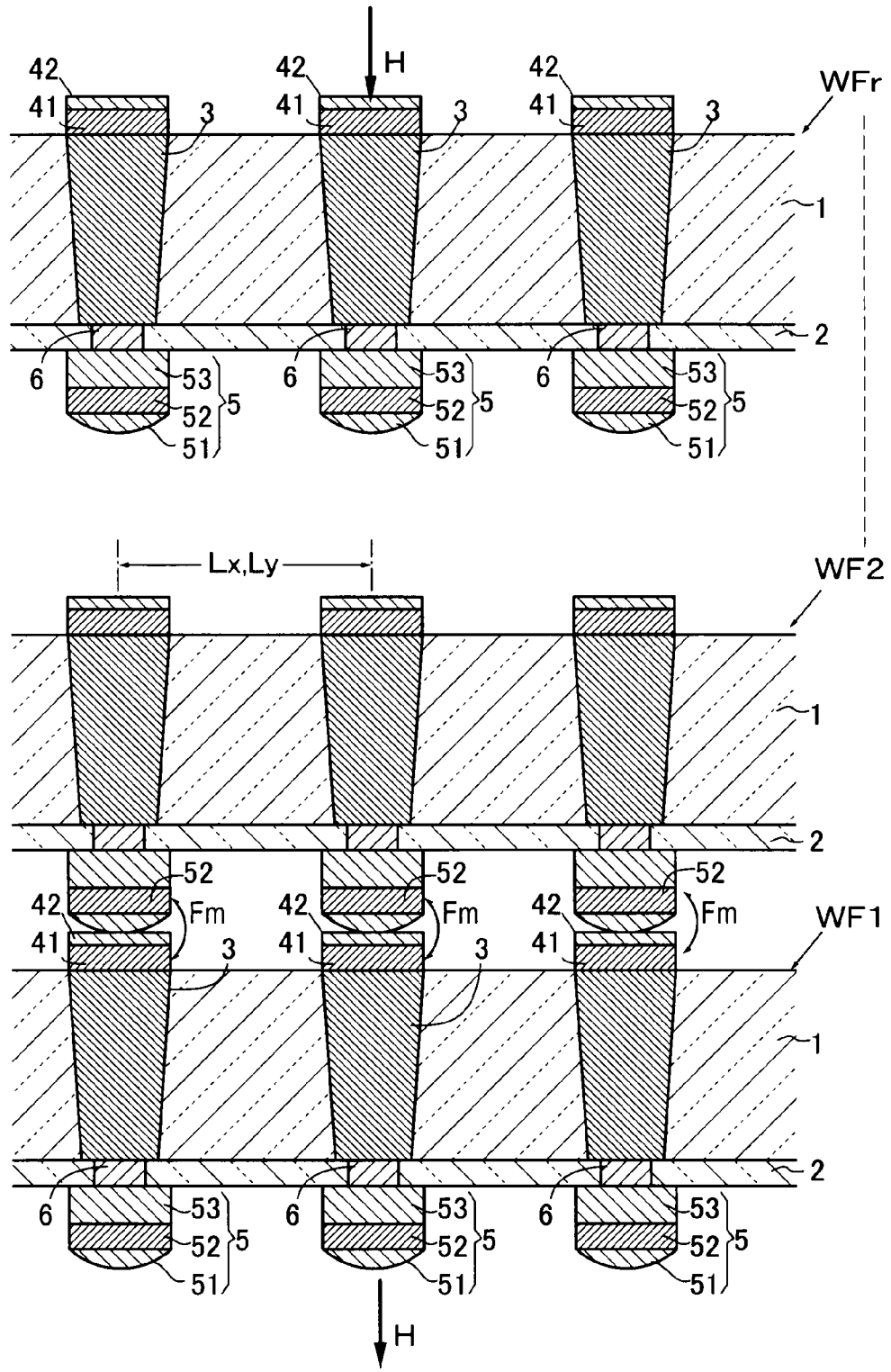
FIG. 1 is a drawing showing a method for manufacturing an electronic device according to the present invention.

FIG. 1 shows an electronic device manufacturing method including a step of aligning and stacking a plurality r of substrates WF1 to WFr (r is a natural number equal to or greater than 2). Although FIG. 1 only shows a substrate of a simple structure, it may actually have a more complicated structure in order to realize appropriate function and structure depending on the type of an intended electronic device.

The substrates WF1 to WFr may include various types of semiconductor substrates, dielectric substrates, insulating substrates, magnetic substrates, or composite substrates thereof. In the present embodiment, the substrates WF1 to WFr are silicon wafers and have a structure that a functional layer 2 having a semiconductor circuit 6 such as a CMOS is laid on one side of a support layer 1 being a silicon layer.

Figure 2:
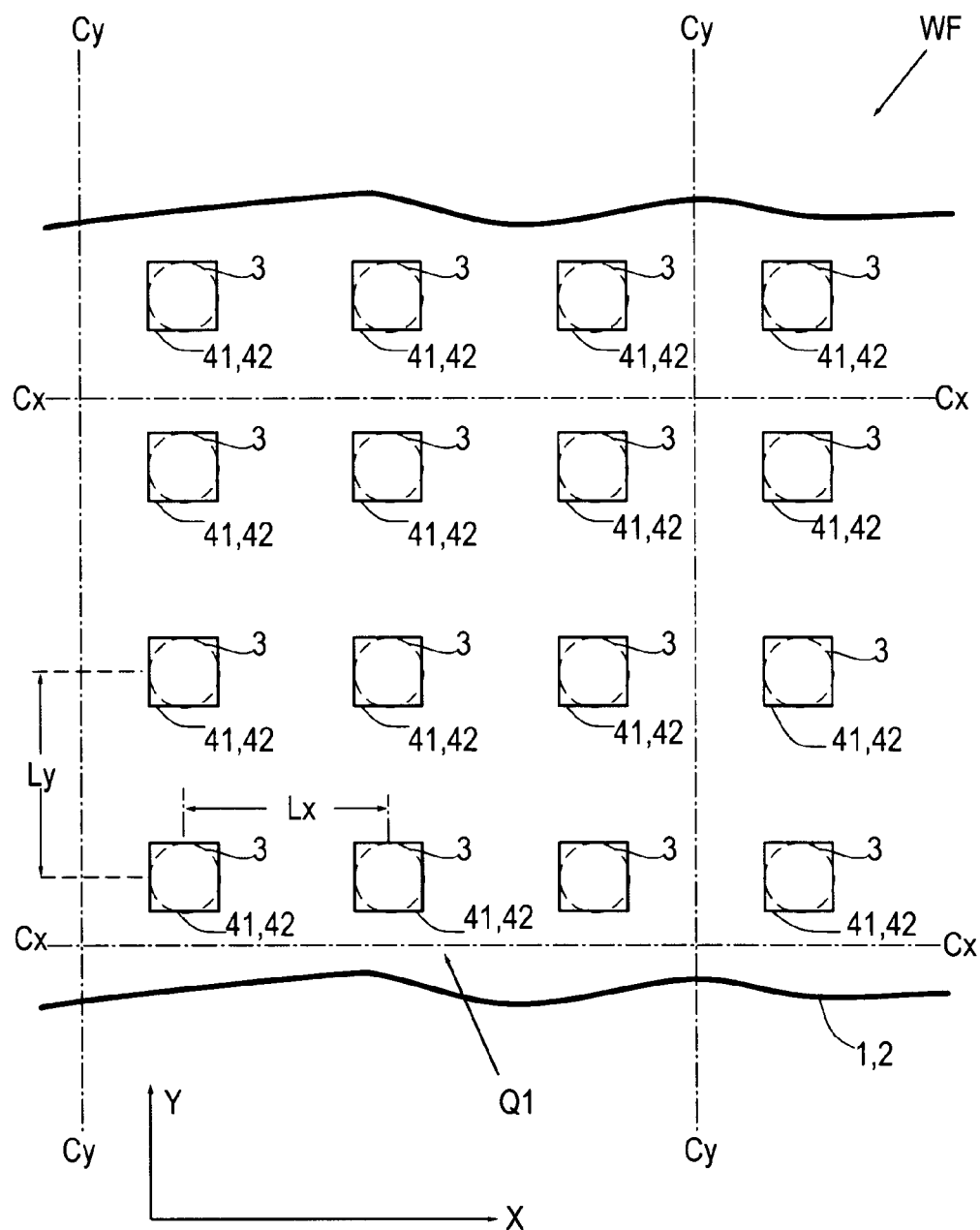
FIG. 2 is a plan view showing a part of a substrate intended for use in implementation of the manufacturing method shown in FIG. 1.
Figure 3:
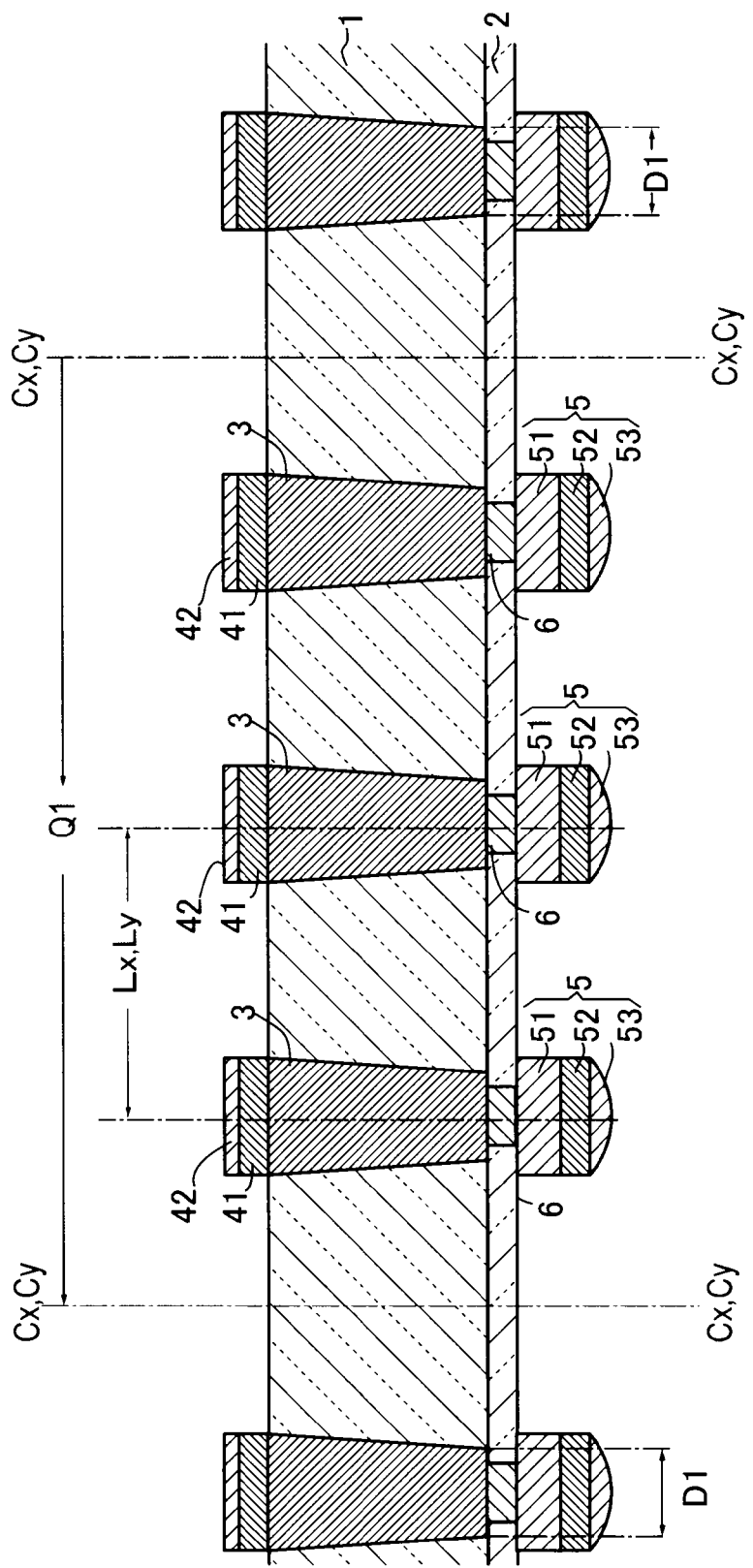
FIG. 3 is a sectional view showing a part of a substrate intended for use in implementation of the manufacturing method shown in FIG. 1.

Each of the substrates WF1 to WFr includes a plurality of vertical conductors 3 and magnetic films 41, as also shown in FIGS. 2 and 3. The vertical conductors 3 are distributed in rows with respect to a substrate surface. The vertical conductor 3 may be a through electrode filling a through hole passing through the substrate WF1 to WFr or an electrode filling a blind hole whose bottom is closed. In the present embodiment, the vertical conductor 3 is a through electrode passing through the support layer 1 and provided for each semiconductor circuit 6 with one end connected to the semiconductor circuit 6 so as to serve as a connecting wire to the semiconductor circuit 6.

In an X-Y plane assumed on the substrate surface, as shown in FIG. 2, the vertical conductors 3 and the semiconductor circuits 6 are arranged in rows, for example, in the form of matrix, at a given arrangement pitch Lx, Ly in X, Y directions. For example, the vertical conductors 3 are dimensioned such that the arrangement pitch Lx, Ly is in the range of 4 to 100 μm and a maximum diameter is in the range of 0.5 to 25 μm. However, it is not necessary for the arrangement pitch Dx, Dy to be constant.

In general, an area containing a plurality of vertical conductors 3 and semiconductor circuits 6 in both the X, Y directions forms a single chip area Q1 as an electronic device. Although the number of vertical conductors 3 and semiconductor circuits 6 contained in the single chip area Q1 is 9 in the present embodiment, it is any number that changes depending on the electronic device. In order to take out them from the single chip area Q1 as an individual electronic device, cutting is performed along X-direction cutting areas Cx and Y-direction cutting areas Cy.

The vertical conductor 3 may be formed by applying a known technology such as a plating process, a molten metal filling process, or a conductive paste filling process. Materials for forming the vertical conductor 3 may be different for different formation processes. In the case of the plating process, a Cu plating film is widely used; in the case of the molten metal filling process, it is made of a metallic material containing tin (Sn) as a main component and optionally at least one of indium (In), aluminum (Al), or bismuth (Bi).

In order to form the vertical conductor 3, regardless of which formation process is adopted, a vertical hole (through hole via) has to be formed previously. The vertical hole (through hole via) may be formed by a known technology such as a CVD process or a laser drilling process. Regarding the timing of formation of the vertical hole (through hole via), there have been known a so-called via-first approach where the vertical hole (through hole via) is formed before formation of the semiconductor circuit 6 and a so-called via-last approach where the vertical hole (through hole via) is formed after formation of the semiconductor circuit 6, and either approach can be adopted.

The magnetic film 41 is adhered to one end face of the vertical conductor 3, while a junction film 42 is adhered to a surface of the magnetic film 41. The magnetic film 41 is one of the characteristic features of the present invention and serves as a magnetic alignment marker. The magnetic film 41 contains Ni, Co, Fe, or an alloy thereof.

The junction film 42 is provided so as to perform joining upon stacking and made of at least one of metallic materials selected from the group consisting of Sn, Ag, Au, Cu, Al, In, and Bi. Although illustrated as a single layer in the figure, from the viewpoint of improving electrical characteristics, junction strength, fusion characteristics, and the like, it may have a multilayer structure with a plurality of layers being a selective combination of the above metallic materials or a combination of the above metallic materials and another metallic material.

The functional layer 2 has bumps 5 on a side (lower side in FIG. 1) opposite to the side where the support layer 1 is disposed. The bump 5 serves as a wire for the semiconductor circuit 6 on the side opposite to the vertical conductor 3. In the illustrated embodiment, the bump 5 is formed by stacking a first junction film 51, a magnetic film 52, and a second junction film 53 in order. The first junction film 51 is provided so as to perform joining upon stacking, while the second junction film 53 is joined to the semiconductor circuit 6. The first junction film 51 and the second junction film 53 are made of at least one of metallic materials selected from the group consisting of Sn, Ag, Au, Cu, Al, In, and Bi. Although illustrated as a single layer in the figure, from the viewpoint of improving electrical characteristics, junction strength, fusion characteristics, and the like, they may have a multilayer structure with a plurality of layers being a selective combination of the above metallic materials or a combination of the above metallic materials and another metallic material. This is similar to the case of the junction film 42.

The magnetic film 52 is disposed between the first junction film 51 and the second junction film 53 and serves as a magnetic alignment marker like the magnetic film 41. The magnetic film 52 contains Ni, Co, Fe, or an alloy thereof.

Upon stacking and aligning, as shown in FIG. 1, the plurality of substrates WF1 to WFr are preliminarily aligned to have the vertical conductors 3 overlap with each other and then stacked in order. At this point, the vertical conductors 3 of the substrates WF1 to WFr overlap with each other to some extent but are not accurately aligned with each other.

In this stacked state, therefore, an external magnetic field H is applied to produce a magnetic attractive force Fm between the magnetic films 41, 52 of adjacent substrates WF1 to WFr and align them by the magnetic attractive force Fm. Between the adjacent substrates WF1, WF2, for instance, the magnetic attractive force Fm acts between the magnetic films 41 of the substrate WF1 and the magnetic films 52 of the substrate WF2 to align the vertical conductors 3 of the substrate WF1 with the vertical conductors 3 of the substrate WF2 with high accuracy.

With the above magnetic alignment operation, the preliminarily aligned vertical conductor 3 of the substrate WF1 to WFr can be further aligned with high accuracy. The magnetic field H can be applied with a not shown permanent magnet or electromagnet.

In the present invention, as described above, the magnetic films 41, 52 are disposed in place on substrate surfaces intended to serve as a stacking surface, the magnetic attractive force Fm is produced between the magnetic films 41, 52 of adjacent substrates WF1 to WFr, and the substrate WF1 to WFr, particularly the vertical conductors 3, are aligned using the magnetic attractive force Fm, so that the alignment of the substrate WF1 to WFr upon stacking during production of an electronic device using a TSV technology can be performed simply, certainly, and accurately as compared with the conventional image processing.

Figure 4:
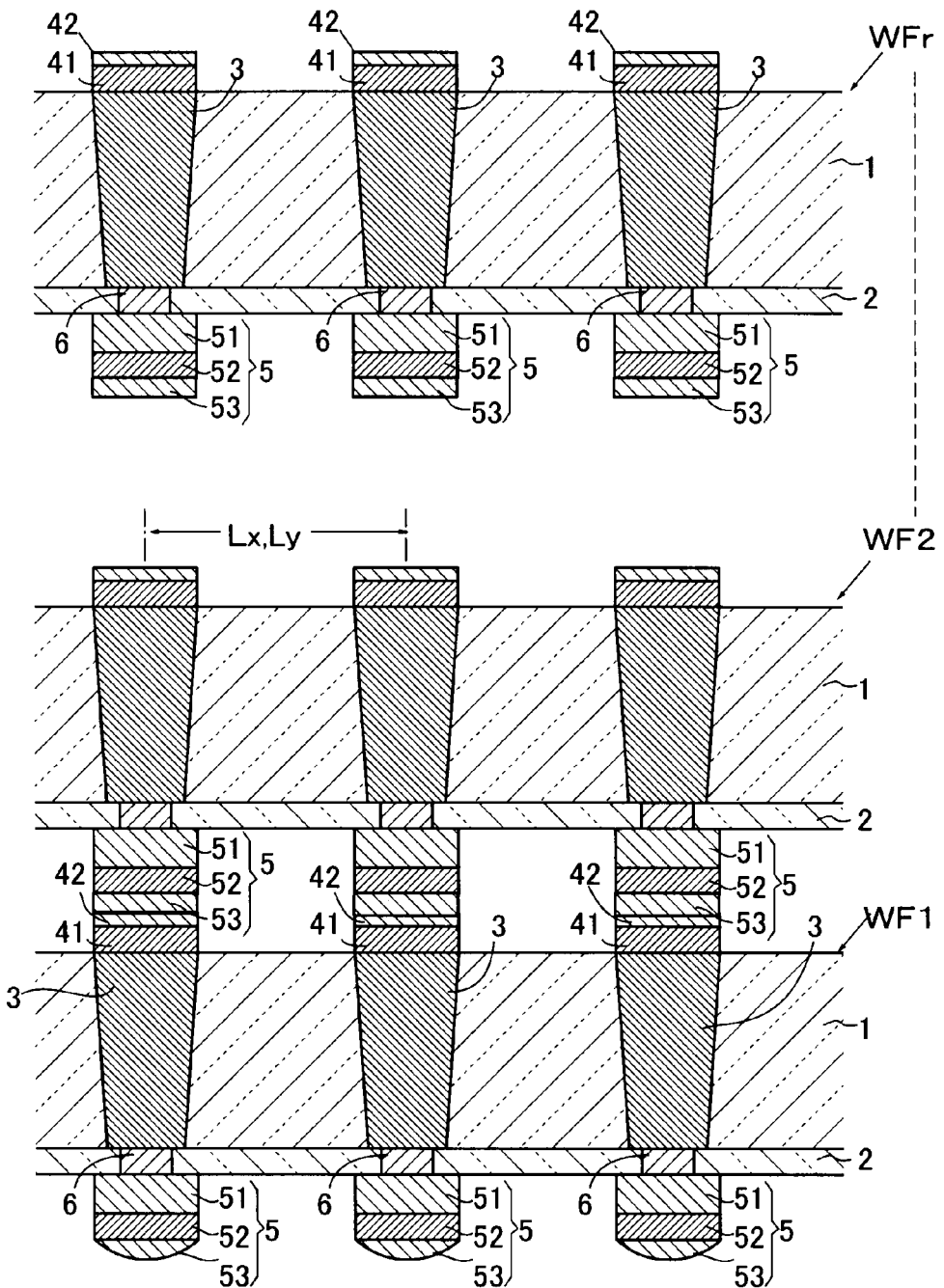
FIG. 4 is a drawing showing a stack or an electronic device obtained through the manufacturing method shown in FIG. 1.

After the alignment, a heat treatment is performed to join the substrates WF1 to WFr. Thus, a stack for an electronic device can be obtained. More particularly, as shown in FIG. 4, between adjacent ones of the substrates WF1 to WFr, for instance, between the substrates WF1 and WF2, the junction films 42 provided in the substrate WF1 are joined to the second junction films 53 of the bumps 5 provided in the substrate WF2. If the joining process is performed within a magnetic field, the magnetic attractive force can act between the stacked substrates WF1 to WFr during that time, so that the substrates WF1 to WFr can be prevented from being displaced during the joining process.

Figure 5:
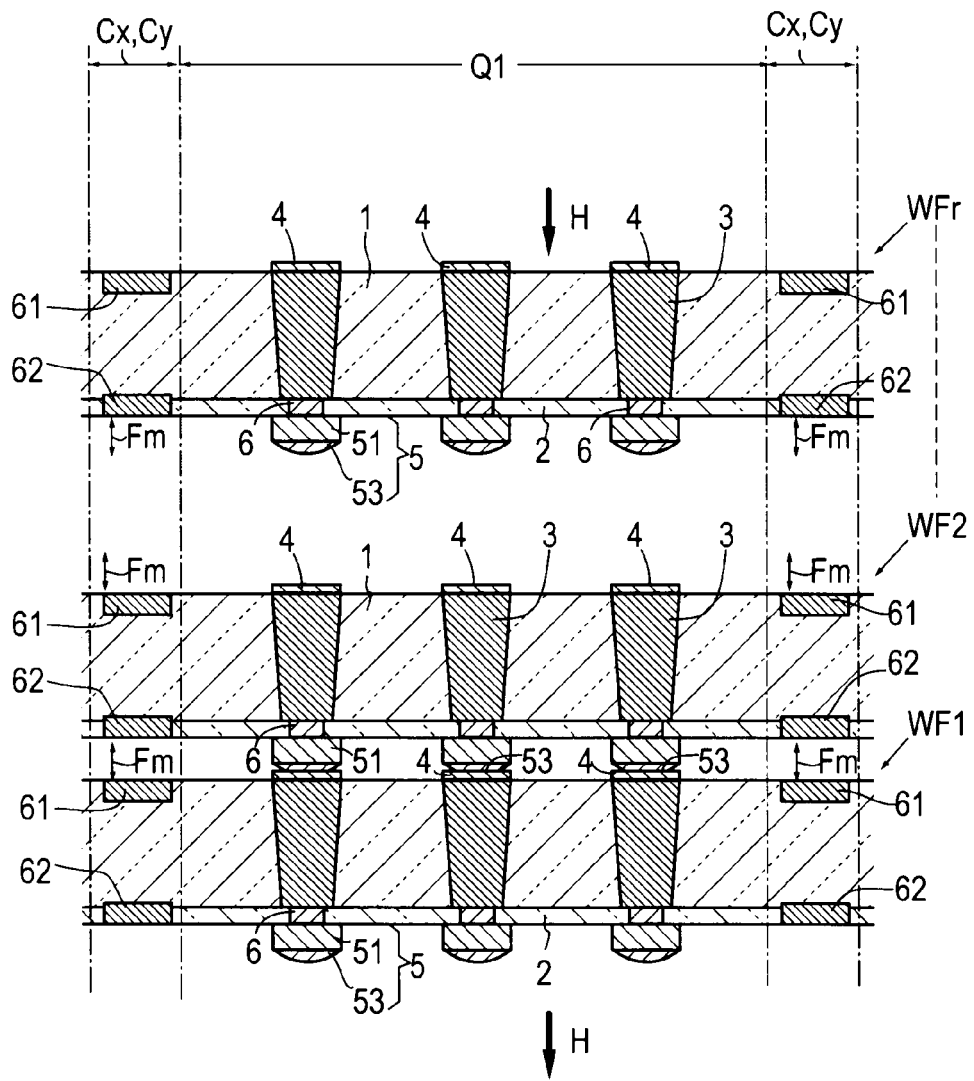
FIG. 5 is a drawing showing another embodiment of a method for manufacturing an electronic device according to the present invention.

The magnetic film may be disposed outside the vertical conductor 3 at the substrate surface. FIG. 5 shows one example thereof. Referring to FIG. 5, in each of the substrates WF1 to WFr, magnetic films 61, 62 are disposed at the X-direction cutting areas Cx and the Y-direction cutting areas Cy defining the single chip area Q1. Preferably, the magnetic films 61, 62 are embedded in the support layer 1 and the functional layer 2 such that their film surfaces substantially coincide with the surface of the support layer 1 and the surface of the functional layer 2. To one end face of the vertical conductor 3, the junction film 4 is directly attached without having any magnetic film. On the other hand, the bump 5 is formed by stacking the first junction film 51 and the second junction film 53 without having any magnetic film. However, it should not be construed as excluding a combination with a structure having magnetic films arranged as shown in FIGS. 1 to 4.

The plurality of substrates WF1 to WFr are preliminarily aligned to have the vertical conductors 3 overlap with each other and then stacked in order. In this stacked state, then, an external magnetic field H is applied to produce a magnetic attractive force Fm between the magnetic films 61, 62 of adjacent substrates WF1 to WFr and align them by the magnetic attractive force Fm. With this, the preliminarily aligned vertical conductor 3 of the substrate WF1 to WFr can be further aligned with high accuracy.

In the present embodiment, the magnetic films 61, 62 are disposed at the X-direction cutting areas Cx and the Y-direction cutting areas Cy, so that when cutting is performed along the X-direction cutting areas Cx and the Y-direction cutting areas Cy so as to obtain a single chip, the magnetic films 61, 62 can be entirely removed by the width of a cutting blade and will never be left on the individual chips.

Figure 6:
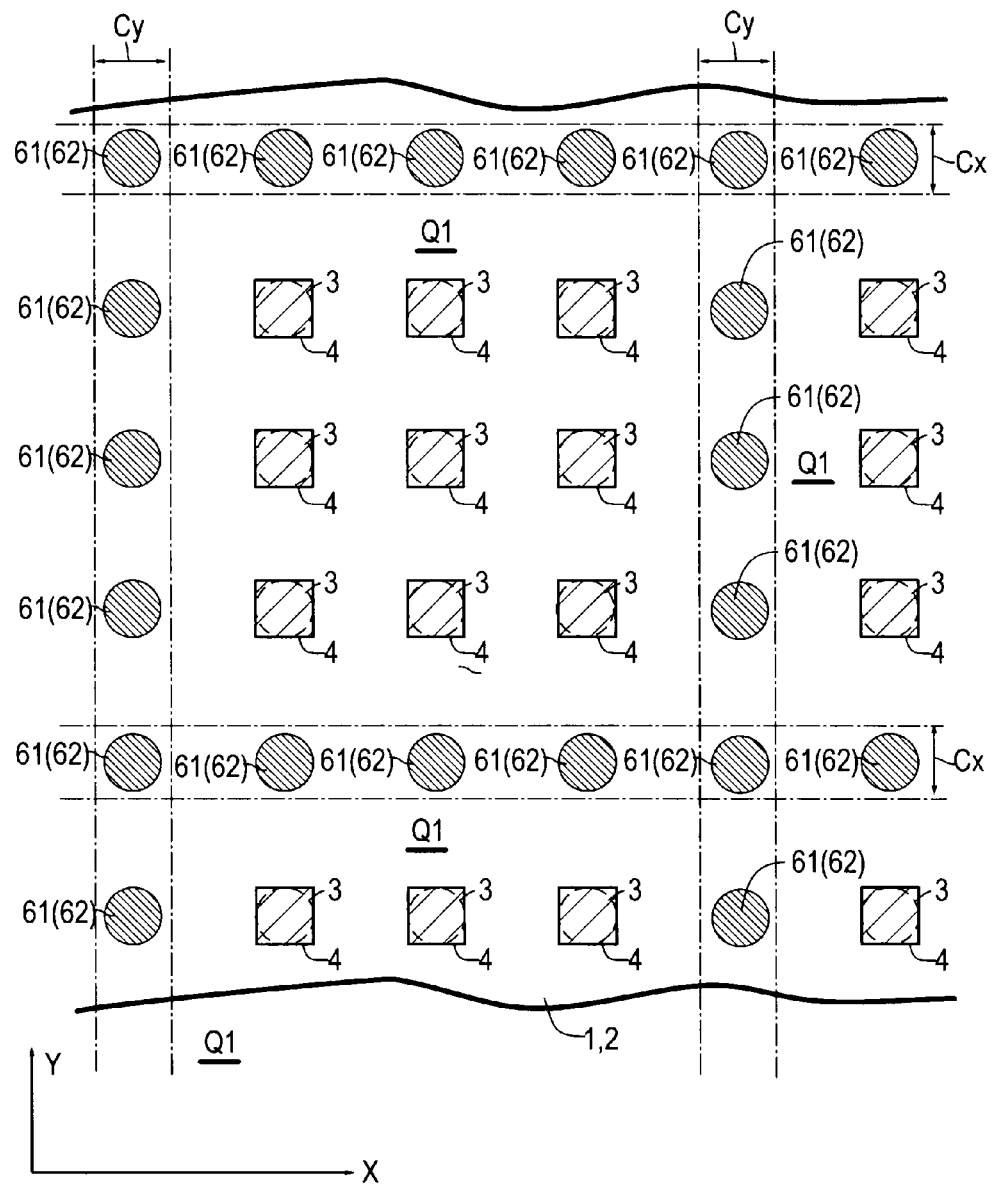
FIG. 6 is a plan view showing a part of a substrate intended for use in implementation of the manufacturing method shown in FIG. 5.

The magnetic films 61, 62 may have any pattern which contributes to the effective alignment using the magnetic attractive force Fm. FIG. 6 shows one example thereof. In FIG. 6, the magnetic films 61, 62 are disposed to fill holes that are formed in the support layer 1 or the functional layer 2 at the same arrangement pitch as the vertical conductors 3. The magnetic films 61, 62 are formed in the X-direction cutting areas Cx and the Y-direction cutting areas Cy to have a diameter that is smaller than a cutting width. Thus, when cutting is performed along the X-direction cutting areas Cx and the Y-direction cutting areas Cy so as to obtain a single chip, the magnetic films 61, 62 can be entirely removed by the width of a cutting blade and will never be left on the individual chips.

Although not shown, the magnetic films 61, 62 may take various forms to include an embodiment in which they extend linearly along the X-direction cutting areas Cx and the Y-direction cutting areas Cy and beyond the single chip area Q, an embodiment in which they extend linearly but are discontinuous between different chip areas, and an embodiment in which the they are disposed at corners of the chip area Q1.

The electronic device according to the present invention typically takes the form of a three-dimensional system-in-package (3D-SiP). Specifically, it may be a system LSI, a memory LSI, an image sensor, a MEMS, or the like. It may also be an electronic device including an analog or digital circuit, a memory circuit such as a DRAM, a logic circuit such as a CPU, or the like or an electronic device that is obtained by preparing different types of circuits such as an analog high frequency circuit and a low frequency, low power consumption circuit in different processes and stacking them.

More specifically, they include most of electronic devices having an electronic circuit as a functional element, such as a sensor module, an optoelectronic module, a unipolar transistor, a MOS FET, a CMOS FET, a memory cell, integrated circuits (IC) thereof, or various scales of LSIs. In the present invention, integrated circuits called "LSI" include all types of integrated circuits such as a small-scale integration, a medium-scale integration, a large-scale integration, a very-large-scale integration (VLSI), an ultra-large-scale integration (ULSI), and so on.

The manufacturing method according to the present invention can be employed for manufacturing an extremely wide variety of electronic devices, as described above. In some of the electronic devices, a stack such as shown in FIG. 4 occupies most of the electronic device by itself, or another circuit functional part may be disposed above or below the stack shown in FIG. 4 with an interposer between or without any interposer between.

The present invention has been described in detail above with reference to preferred embodiments. However, obviously those skilled in the art could easily devise various modifications of the invention based on the technical concepts underlying the invention and teachings disclosed herein.

What is claimed is:

1. A method for manufacturing an electronic device, comprising a step of aligning and stacking a plurality of substrates, each of the plurality of substrates having a plurality of vertical conductors and magnetic films, the vertical conductors being directed along a thickness direction of the substrate and distributed in a row with respect to a substrate surface, wherein one of the magnetic films is provided on one side of the thickness direction of the substrate, adhered to one end face of a vertical conductor, and covered with a junction film made of metal or alloy, another one of the magnetic films is provided on the other side of the thickness direction of the substrate, and provided above another end face of the vertical conductor and covered with a junction film made of metal or alloy, upon aligning the plurality of substrates, the electronic device manufacturing method including a step of applying an external magnetic field to produce a magnetic attractive force between the magnetic films of adjacent stacked substrates and align the vertical conductors by the magnetic attractive force and join the vertical conductors through the junction films by heat treatment.

2. The manufacturing method as claimed in claim 1, wherein each magnetic film contains one of Ni, Co, Fe, and an alloy thereof.

* * * * *

UNITED STATES PATENT AND TRADEMARK OFFICE
CERTIFICATE OF CORRECTION

PATENT NO. : 8,580,581 B2
APPLICATION NO. : 12/943447
DATED : November 12, 2013
INVENTOR(S) : Shigenobu Sekine et al.

It is certified that error appears in the above-identified patent and that said Letters Patent is hereby corrected as shown below:

On the title page, Item (54), and in the specification, Column 1, the Title is incorrect. Item (54) and Column 1 should read:

--SUBSTRATE FOR ELECTRONIC DEVICE, STACK FOR ELECTRONIC DEVICE, ELECTRONIC DEVICE, AND METHOD FOR MANUFACTURING THE SAME--

Signed and Sealed this
Fourteenth Day of January, 2014

Michelle K. Lee
*Deputy Director of the United States Patent and Trademark Office*